(12) United States Patent
Zhao (10) Patent No.: US 12,527,061 B2
(45) Date of Patent: Jan. 13, 2026

(54) THIN FILM TRANSISTOR, MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Shuning Zhao, Shenzhen (CN)

(*) Notice: Subject to any disclaimer, the term of this patent is extended or adjusted under 35 U.S.C. 154(b) by 516 days.

(21) Appl. No.: 17/622,239

(22) PCT Filed: Dec. 22, 2021

(86) PCT No.: PCT/CN2021/140529
§ 371 (c)(1),
(2) Date: Dec. 23, 2021

(87) PCT Pub. No.: WO2023/108762
PCT Pub. Date: Jun. 22, 2023

(65) Prior Publication Data
US 2024/0038864 A1     Feb. 1, 2024

(30) Foreign Application Priority Data
Dec. 13, 2021 (CN) .......................... 202111523377.1

(51) Int. Cl.
*H10D 64/27*     (2025.01)
*H10D 30/01*     (2025.01)
*H10D 30/67*     (2025.01)

(52) U.S. Cl.
CPC .......... *H10D 64/514* (2025.01); *H10D 30/031* (2025.01); *H10D 30/6723* (2025.01); *H10D 30/673* (2025.01); *H10D 30/6755* (2025.01)

(58) Field of Classification Search
CPC ......... H01L 29/42364; H01L 29/42384; H01L 29/66742; H01L 29/78633; H01L 29/7869;
(Continued)

(56) References Cited

U.S. PATENT DOCUMENTS 6,713,358 B1 * 3/2004 Chau ................ H01L 21/28202
                                                                  438/287
7,211,492 B2 * 5/2007 Forbes .............. H01L 21/31641
                                                                  438/303
(Continued)

FOREIGN PATENT DOCUMENTS

| CN | 105514116 A | 4/2016 |
|---|---|---|
| CN | 105576017 A | 5/2016 |

(Continued)

OTHER PUBLICATIONS

KR 20150065020 A, merged document with English translation (Year: 2015).*
(Continued)

*Primary Examiner* — William B Partridge
*Assistant Examiner* — Linda J. Fleck (57) ABSTRACT

A thin film transistor, a manufacturing method thereof, and a display panel are provided. The thin film transistor includes a semiconductor layer, a gate disposed corresponding to a position of the semiconductor layer, and a gate insulating layer disposed between the semiconductor layer and the gate. The gate insulating layer includes a first gate insulating layer and a second gate insulating layer. A dielectric constant of the first gate insulating layer is greater than a dielectric constant of the second gate insulating layer.

9 Claims, 3 Drawing Sheets (58) Field of Classification Search
CPC ........... H01L 29/66969; H01L 29/4908; H01L 29/511; H10D 64/514; H10D 30/031; H10D 30/6723; H10D 30/673; H10D 30/6755; H10D 30/6739; H10D 99/00
See application file for complete search history.

(56) References Cited

U.S. PATENT DOCUMENTS

| | | | |
|---|---|---|---|
| 2002/0042193 A1* | 4/2002 | Noguchi | H01L 21/7684 438/677 |
| 2002/0135030 A1* | 9/2002 | Horikawa | H01L 29/518 257/E21.639 |
| 2004/0168627 A1* | 9/2004 | Conley, Jr. | C30B 25/14 117/89 |
| 2005/0098839 A1* | 5/2005 | Lee | H01L 21/823857 257/E21.639 |
| 2005/0130326 A1* | 6/2005 | Lee | H01L 21/31645 438/398 |
| 2005/0233598 A1* | 10/2005 | Jung | C23C 16/45529 438/785 |
| 2005/0258491 A1* | 11/2005 | Bojarczuk | H01L 21/28202 257/E21.639 |
| 2007/0026688 A1* | 2/2007 | Song | C23C 16/515 438/785 |
| 2008/0308865 A1* | 12/2008 | Wang | H10D 64/691 257/E21.2 |
| 2013/0146862 A1* | 6/2013 | Kim | H01L 29/7869 257/43 |
| 2014/0027859 A1* | 1/2014 | Gerhardt | H10D 64/514 257/E27.06 |
| 2014/0346582 A1* | 11/2014 | Reyes | G11C 16/0416 438/257 |
| 2016/0293727 A1* | 10/2016 | Zhang | H10D 64/017 |
| 2018/0097047 A1* | 4/2018 | Jung | H10K 59/123 |
| 2020/0176582 A1* | 6/2020 | Rode | H10D 30/43 |
| 2024/0186399 A1* | 6/2024 | Salahuddin | H10D 64/01 |
| 2024/0194479 A1* | 6/2024 | Sun | H01L 27/1255 |

FOREIGN PATENT DOCUMENTS

| | | | | |
|---|---|---|---|---|
| CN | 106992190 A | | 7/2017 | |
| CN | 107689345 A | * | 2/2018 | ............ H01L 21/77 |
| CN | 110729357 A | | 1/2020 | |
| CN | 111192884 A | | 5/2020 | |
| JP | 2006019551 A | * | 1/2006 | |
| JP | 2006173532 A | | 6/2006 | |
| JP | 2006229185 A | | 8/2006 | |
| KR | 100762239 B1 | * | 10/2007 | ........... H10D 64/691 |
| KR | 20090117582 A | | 11/2009 | |
| KR | 20150065020 A | * | 6/2015 | |
| KR | 20200112788 A | * | 10/2020 | |

OTHER PUBLICATIONS

KR 20200112788 A, merged document with English translation from KIPO (Year: 2020).*
International Search Report in International application No. PCT/CN2021/140529, mailed on Jul. 28, 2022.
Written Opinion of the International Search Authority in International application No. PCT/CN2021/140529, mailed on Jul. 28, 2022.
Chinese Office Action issued in corresponding Chinese Patent Application No. 202111523377.1 dated Jun. 21, 2024, pp. 1-12.

* cited by examiner

THIN FILM TRANSISTOR, MANUFACTURING METHOD THEREOF, AND DISPLAY PANEL

FIELD OF INVENTION

The present application relates to the field of display technologies, and more particularly to a thin film transistor, a manufacturing method thereof, and a display panel.

BACKGROUND OF INVENTION

A narrow bezel design is an important means to increase an effective screen-to-body ratio of display devices, and it is also the main development trend of display screens in the future. GOA (gate on array) technology is of great significance for realizing the narrow bezel design of display devices. But as a frame size is further reduced, Sizes of TFTs (thin film transistors) in a GOA circuit are also compressed. However, a reduction in the sizes of the TFTs may result in weakening of the TFT's own conduction current capacity, which cannot meet functional requirements of the display device.

Technical Problem

A current thin film transistor has a technical problem of low current capacity.

SUMMARY OF INVENTION

The present application provides a thin film transistor, a manufacturing method thereof, and a display panel, which are used to alleviate the technical problem of low current conduction capability of the current thin film transistor.

The application provides a thin film transistor comprising a semiconductor layer, a gate disposed corresponding to a position of the semiconductor layer, and a gate insulating layer disposed between the semiconductor layer and the gate; wherein:

The gate insulating layer comprises a first gate insulating layer disposed close to the semiconductor layer and a second gate insulating layer disposed close to the gate, and a dielectric constant of the first gate insulating layer is greater than a dielectric constant of the second gate insulating layer.

In the thin film transistor of the present application, a dielectric constant of the gate insulating layer is greater than 4.

In the thin film transistor of the present application, the dielectric constant of the first gate insulating layer is greater than 9.

In the thin film transistor of the present application, a thickness of the first gate insulating layer is greater than a thickness of the second gate insulating layer.

In the thin film transistor of the present application, the first gate insulating layer comprises hafnium oxide or aluminum oxide, and the second gate insulating layer comprises silicon oxide.

In the thin film transistor of the present application, the first gate insulating layer comprises hafnium oxide or aluminum oxide, and the second gate insulating layer comprises hafnium oxide or aluminum oxide.

In the thin film transistor of the present application, the gate insulating layer is made of at least one of hafnium oxide and aluminum oxide.

In the thin film transistor of the present application, a thickness of the gate insulating layer ranges from 900 angstroms to 3000 angstroms.

The application also provides a display panel comprising a substrate and a thin film transistor disposed on the substrate, wherein the thin film transistor comprises:
  a semiconductor layer disposed on a surface of the substrate;
  a gate insulating layer disposed on the semiconductor layer, wherein the gate insulating layer comprises a first gate insulating layer disposed close to the semiconductor layer and a second gate disposed on the first gate insulating layer, and a dielectric constant of the first gate insulating layer is greater than a dielectric constant of the second gate insulating layer;
  a gate disposed on the gate insulating layer and corresponding to a position of the semiconductor layer.

In the display panel of this application, the display panel further comprises:
  a light shielding layer disposed on the substrate;
  a buffer layer disposed on the light shielding layer;
  an interlayer insulating layer disposed on the buffer layer and covering the semiconductor layer, the gate insulating layer, and the gate;
  source and drain electrodes disposed on the interlayer insulating layer; and
  a passivation layer disposed on the interlayer insulating layer and covering the source and drain electrodes;
  wherein the semiconductor layer is disposed on the buffer layer, and the source and drain electrodes are connected to the semiconductor layer through via holes on the interlayer insulating layer.

In the display panel of this application, a dielectric constant of the gate insulating layer is greater than 4.

In the display panel of this application, the dielectric constant of the first gate insulating layer is greater than 9.

In the display panel of this application, a thickness of the first gate insulating layer is greater than a thickness of the second gate insulating layer.

In the display panel of this application, the first gate insulating layer comprises hafnium oxide or aluminum oxide, and the second gate insulating layer comprises silicon oxide.

In the display panel of this application, the first gate insulating layer comprises hafnium oxide or aluminum oxide, and the second gate insulating layer comprises hafnium oxide or aluminum oxide.

In the display panel of this application, a thickness of the gate insulating layer ranges from 900 angstroms to 3000 angstroms.

In the display panel of this application, a material for making the light shielding layer comprises molybdenum, aluminum, copper, and titanium, and a thickness of the light shielding layer ranges from 500 angstroms to 2000 angstroms.

In the display panel of this application, a part of the source and drain electrodes are electrically connected to the light shielding layer through via holes penetrating the interlayer insulating layer and the buffer layer.

This application provides a method for manufacturing a thin film transistor, which comprises:
  forming a semiconductor layer on a substrate;
  forming a gate insulating layer corresponding to a position of the semiconductor layer on the semiconductor layer, wherein the gate insulating layer comprises a first gate insulating layer disposed close to the semiconductor layer and a second gate disposed on the first gate insulating layer, and a dielectric constant of the first gate insulating layer is greater than a dielectric constant of the second gate insulating layer;

forming a gate corresponding to the position of the semiconductor layer on the gate insulating layer.

In the method of manufacturing the thin film transistor of this application, a step of forming the gate insulating layer corresponding to the position of the semiconductor layer on the semiconductor layer comprises:

forming the first gate insulating layer on the semiconductor layer using hafnium oxide or aluminum oxide;

forming the second gate insulating layer on the first gate insulating layer using silicon oxide.

Beneficial Effect

The application provides a thin film transistor, a manufacturing method thereof, and a display panel. The thin film transistor includes a semiconductor layer, a gate provided corresponding to the position of the semiconductor layer, and a gate insulating layer provided between the semiconductor layer and the gate. The gate insulating layer includes a first gate insulating layer disposed close to the semiconductor layer and a second gate insulating layer disposed close to the gate. The dielectric constant of the first gate insulating layer is greater than the dielectric constant of the second gate insulating layer. In this application, a double-layered gate insulating layer is provided, and the dielectric constant of the first gate insulating layer is greater than the dielectric constant of the second gate insulating layer. This improves a current capacity of the thin film transistor. Compared with current thin film transistors, under the same size and the same driving conditions, a larger current can be conducted in the semiconductor layer of the thin film transistor of the present application. Under the condition of conducting the same magnitude of current, the thin film transistor of the present application can realize a smaller size design.

DESCRIPTION OF DRAWINGS

In order to explain the embodiments or the technical solutions in the prior art more clearly, the following will briefly introduce the drawings that need to be used in the description of the embodiments or the prior art. Obviously, the drawings in the following description are only some embodiments of the application. For those of ordinary skill in the art, other drawings can be obtained based on these drawings without creative work.

DETAILED DESCRIPTION OF PREFERRED EMBODIMENTS

The following descriptions of the embodiments of the invention refer to the attached drawings to illustrate specific invention embodiments that the invention can be implemented. Directional terms mentioned in the present invention, such as "upper", "lower", "front", "rear", "left", "right", "inner", "outer", "side", etc., are only the directions for referring to the attached drawings. Therefore, the directional terms used are used to illustrate and understand the application, rather than to limit the application. In the figure, units with similar structures are indicated by the same reference numerals.

The application provides a thin film transistor, a manufacturing method thereof, and a display panel. The thin film transistor includes a semiconductor layer, a gate provided corresponding to the position of the semiconductor layer, and a gate insulating layer provided between the semiconductor layer and the gate. The gate insulating layer includes a first gate insulating layer disposed close to the semiconductor layer and a second gate insulating layer disposed close to the gate. The dielectric constant of the first gate insulating layer is greater than the dielectric constant of the second gate insulating layer. In this application, a double-layered gate insulating layer is provided, and the dielectric constant of the first gate insulating layer is greater than the dielectric constant of the second gate insulating layer. This improves a current capacity of the thin film transistor. Compared with current thin film transistors, under the same size and the same driving conditions, a larger current can be conducted in the semiconductor layer of the thin film transistor of the present application. Under the condition of conducting the same magnitude of current, the thin film transistor of the present application can realize a smaller size design.

The structural and functional characteristics of the thin film transistor provided by the embodiments of the present application will be described below in conjunction with the accompanying drawings.

Figure 1:
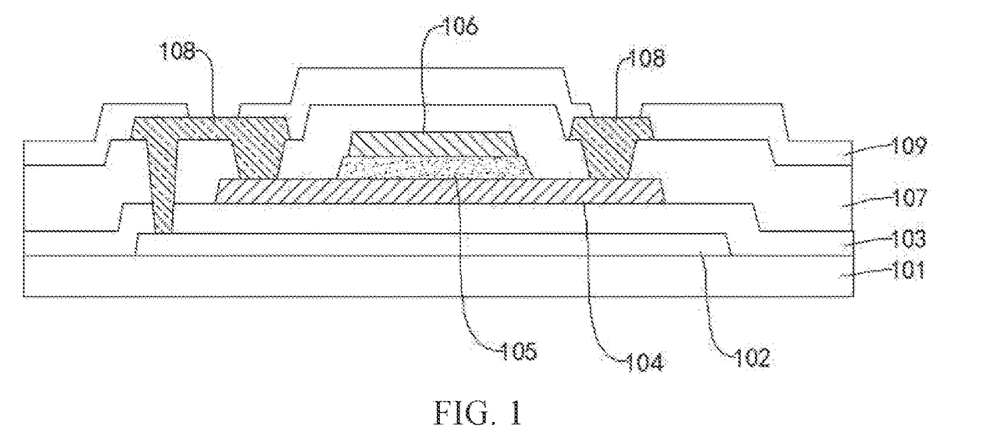
FIG. 1 is a schematic diagram of a first partial structure of a display panel including thin film transistors provided by an embodiment of the present application.

Referring to FIG. 1, which is a schematic diagram of a first partial structure of a display panel including a thin film transistor provided by an embodiment of the present application. The thin film transistor includes a semiconductor layer 104, a gate 106 arranged corresponding to a position of the semiconductor layer 104, and a gate insulating layer 105 arranged between the semiconductor layer 104 and the gate 106. It can be understood that the semiconductor layer 104 described in this embodiment refers to a specific structure made of semiconductor layer materials. The material for making the semiconductor layer 104 may be one or more of indium gallium zinc oxide, indium tin zinc oxide, indium zinc tin oxide, indium gallium tin zinc oxide, and the like. The position of the gate 106 corresponding to the position of the semiconductor layer 104 means that for a single thin film transistor, the gate 106 and the semiconductor layer 104 jointly constitute the thin film transistor. The gate 106 may be provided in a middle position corresponding to an area where the semiconductor layer 104 is located. Therefore, its projection is located within the range of the semiconductor layer 104. The extension length of the gate insulating layer 105 between the gate 106 and the semiconductor layer 104 can be set according to actual needs.

In addition, the gate 106 of the thin film transistor shown in FIG. 1 is located above the semiconductor layer 104 and is a thin film transistor with a top gate structure, but the present application is not limited to this. In some other embodiments, the gate of the thin film transistor may also be located under the semiconductor layer, thereby forming a thin film transistor with a bottom gate structure. Whether it is a thin-film transistor with a top-gate structure or a thin-film transistor with a bottom-gate structure, the gate insulating layer 105 is located between the gate 106 and the semiconductor layer 104 to play an insulating and dielectric function.

In this embodiment, the dielectric constant of the gate insulating layer 105 is greater than 4. It can be understood that a saturation area current of the thin film transistor is positively correlated with the inductive capacitance between the gate 106 of the thin film transistor and the semiconductor layer 104. The inductive capacitance and the dielectric constant of the gate insulating layer 105 are positively correlated. That is, the greater the dielectric constant of the gate insulating layer 105, the greater the inductive capacitance, and thus the saturation current of the thin film transistor. In this embodiment, in view of the technical problem of low saturation current of the existing thin film transistors, it is proposed to set the dielectric constant of the gate insulating layer 105 to be greater than 4. By increasing the dielectric constant of the gate insulating layer 105, the current conduction capability of the thin film transistor is improved. The technical feature that the dielectric constant of the gate insulating layer 105 is greater than 4 is obtained on the basis of creative experiments, calculations, and optimizations. Thin film transistors that meet this condition can exhibit better current conduction capabilities.

Optionally, the gate insulating layer 105 is a single-layer film structure made of at least one of hafnium oxide and aluminum oxide. The thickness of the formed gate insulating layer 105 ranges from 900 angstroms to 3000 angstroms. It can be understood that, in this embodiment, hafnium oxide and aluminum oxide materials with a relatively high dielectric constant are used to make the gate insulating layer 105, so that the conductive current capability of the thin film transistor is improved. Compared with current thin film transistors, under the same size and the same driving conditions, a larger current can be conducted in the semiconductor layer of the thin film transistor of the present application. Under the condition of conducting the same magnitude of current, the thin film transistor of the present application can realize a smaller size design.

Optionally, the gate insulating layer 105 may also be a multilayer structure composed of a hafnium oxide film layer and an aluminum oxide film layer, such as a hafnium oxide/aluminum oxide double-layer structure, an aluminum oxide/hafnium oxide double-layer structure, or a hafnium oxide/aluminum oxide/hafnium oxide three-layer structure.

Further, please continue to refer to FIG. 1, an embodiment of the present application also provides a display panel. The display panel includes the thin film transistor as described above. Specifically, the display panel includes a substrate 101. The thin film transistor is arranged on a surface of the substrate 101. The substrate 101 may be a hard substrate, such as glass, or the like, or a flexible substrate, such as polyimide. The substrate 101 is used to provide a first layer supporting plane for various components in the thin film transistor. Other components in the thin film transistor are stacked on the substrate 101 according to a certain rule to form a device structure with specific functions. In this embodiment, the substrate 101 may be a transparent structure. In some other embodiments, it can also be set to a non-transparent structure according to requirements.

The display panel further includes a light shielding layer 102 disposed on the substrate 101. The light shielding layer 102 may be made of opaque metal materials, such as molybdenum, aluminum, copper, titanium, and the like. Therefore, the light shielding layer 102 not only has light-shielding ability, but also has certain conductivity. According to requirements, the light shielding layer 102 may be a single-layer or double-layer film structure made of one or more of the foregoing metal materials. In this embodiment, the thickness of the light shielding layer 102 on the substrate 101 may range from 500 angstroms to 2000 angstroms. The light shielding layer 102 defines a light-shielding area in the thin film transistor. It can be understood that when the semiconductor layer material in the thin film transistor is irradiated by light, its performance will decrease. Therefore, the arrangement position of the light shielding layer 102 needs to correspond to the arrangement position of the semiconductor layer in the thin film transistor, so as to shield the light directed to the semiconductor layer.

The display panel further includes a buffer layer 103 disposed on the substrate 101 and covering the light shielding layer 102. The buffer layer 103 may be a single-layer film or a double-layer film made of silicon nitride, silicon oxide, or one of the two. The thickness of the buffer layer 103 ranges from 1000 angstroms to 5000 angstroms.

The semiconductor layer 104 is arranged on the buffer layer 103, and the arrangement position of the semiconductor layer 104 corresponds to the arrangement position of the light shielding layer 102. That is, the orthographic projection of the semiconductor layer 104 on the light shielding layer 102 is located within the distribution range of the light shielding layer 102. The gate insulating layer 105 and the gate 106 are sequentially stacked on the semiconductor layer 104 and are in the same thin film transistor. The gate insulating layer 105 and the gate 106 are arranged close to the middle area of the semiconductor layer 104 and do not cover at least two side edge areas of the semiconductor layer 104. The semiconductor layer 104 that is not covered by the gate insulating layer 105 and the gate 106 forms an active conductive area through a plasma doping process. The semiconductor layer 104 covered by the gate insulating layer 105 and the gate 106 naturally forms a channel area.

The display panel further includes an interlayer insulating layer 107 disposed on the buffer layer 103 and covering the semiconductor layer 104, the gate insulating layer 105, and the gate 106. The interlayer insulating layer 107 may be made of silicon oxide material, and its thickness may range from 500 angstroms to 5000 angstroms. The interlayer insulating layer 107 is provided with a plurality of via holes, some of the via holes expose the active conductive area of the semiconductor layer 104, and some of the via holes can penetrate the interlayer insulating layer 107 and the buffer layer. 103. Thus, a part of the light shielding layer 102 is exposed. It can be understood that other conductive film layers (such as source and drain electrodes in thin film transistors) may form conductive connections with the semiconductor layer 104 and/or the light shielding layer 102 through these via holes.

The display panel further includes source and drain electrodes 108 disposed on the interlayer insulating layer 107 and a passivation layer 109 disposed on the interlayer insulating layer 107 and covering the source and drain electrodes 108. The source and drain electrodes 108 are coupled to opposite ends of the semiconductor layer 104 through via holes on the interlayer insulating layer 107. That is, the source and drain electrodes 108 are electrically connected to the active conductive area of the semiconductor layer 104, so that current can be transmitted between the source and drain electrodes 108 and the semiconductor layer 104. Part of the source and drain electrodes 108 are electrically connected to the light shielding layer 102 through via holes penetrating the interlayer insulating layer 107 and the buffer layer 103. Using the conductivity of the light shielding layer 102 to transmit electrical signals to a part of the source and drain electrodes 108 is beneficial to improve a response efficiency of the thin film transistor. The material of the source and drain electrodes 108 may be one or more of metal molybdenum, aluminum, copper, and titanium. The source and drain electrodes 108 may have a single-layer structure made of one of the foregoing materials or may have a multi-layer structure made of the foregoing multiple materials. For example, molybdenum/aluminum/molybdenum three-layer structure, molybdenum/copper double-layer structure, or titanium/copper double-layer structure, etc. The thickness of the source and drain electrodes 108 may range from 1000 angstroms to 10000 angstroms.

The passivation layer 109 is provided with openings. The opening exposes a local area of the source and drain electrodes 108 so as to connect the source and drain electrodes 108 with other components. The passivation layer 109 may be made of silicon oxide material, and its thickness may range from 1000 angstroms to 5000 angstroms.

Figure 2:
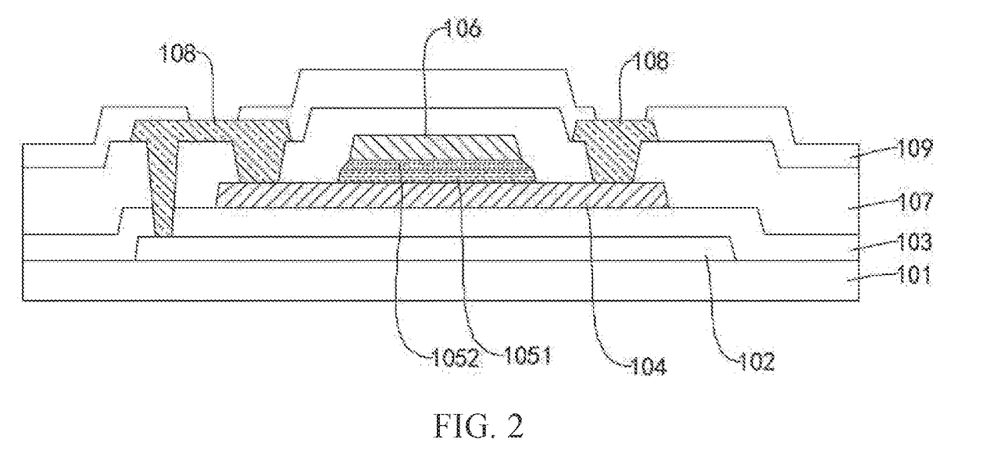
FIG. 2 is a schematic diagram of a second partial structure of a display panel including thin film transistors provided by an embodiment of the present application.

In an embodiment, please refer to FIG. 2, which is a schematic diagram of a second partial structure of a display panel including thin film transistors provided by an embodiment of the present application. The display panel shown in FIG. 2 has the same or similar structure as the display panel shown in FIG. 1. The difference between the two is only in the structure of the gate insulating layer of the thin film transistor. The structural features of the gate insulating layer of the thin film transistor shown in FIG. 2 will be described below. For the characteristics of other components of the thin film transistor shown in FIG. 2, please refer to the record of the above-mentioned embodiment, which will not be repeated here.

In this embodiment, the gate insulating layer includes a first gate insulating layer 1051 disposed close to the semiconductor layer 104 and a second gate insulating layer 1052 disposed close to the gate 106. The dielectric constant of the first gate insulating layer 1051 is greater than the dielectric constant of the second gate insulating layer 1052. The overall dielectric constant of the gate insulating layer composed of the first gate insulating layer 1051 and the second gate insulating layer 1052 is greater than 4. Based on the above description in this document, it can be known that the thin film transistor provided by this embodiment has a good current capacity and can meet the size and current requirements of a small-sized thin film transistor.

Further, the thickness of the first gate insulating layer 1051 is greater than the thickness of the second gate insulating layer 1052. In view of the above-mentioned design that the dielectric constant of the first gate insulating layer 1051 is greater than the dielectric constant of the second gate insulating layer 1052. This embodiment is beneficial to further increase the overall dielectric constant of the gate insulating layer, so that the thin film transistor has a better current capacity.

Optionally, the thickness of the first gate insulating layer 1051 may range from 100 angstroms to 2000 angstroms, and the thickness of the second gate insulating layer 1052 may range from 800 angstroms to 2000 angstroms.

Optionally, the dielectric constant of the first gate insulating layer 1051 is greater than 9, and the node constant of the second gate insulating layer 1052 may not be limited. Therefore, the dielectric constant of the second gate insulating layer 1052 can be greater than 4 or less than 4, as long as the overall dielectric constant of the gate insulating layer is greater than 4.

Optionally, the first gate insulating layer 1051 may be a single-layer film structure made of at least one of hafnium oxide and aluminum oxide. It can be understood that, in this embodiment, the first gate insulating layer 1051 is made of hafnium oxide and aluminum oxide materials with a relatively high dielectric constant. This improves the overall dielectric constant of the gate insulating layer, thereby improving the conductive current capacity of the thin film transistor, and is beneficial to realize a smaller size design of the thin film transistor. In addition, the first gate insulating layer 1051 may also be a multilayer structure composed of a hafnium oxide film layer and an aluminum oxide film layer, such as a hafnium oxide/aluminum oxide double-layer structure, an aluminum oxide/hafnium oxide double-layer structure, or a hafnium oxide/aluminum oxide/hafnium oxide three-layer structure.

Optionally, the second gate insulating layer 1052 may be made of silicon oxide, and the better insulating properties of silicon oxide materials are used to improve the overall insulating ability of the gate insulating layer.

The display panel may be a liquid crystal display panel or an organic light emitting diode display panel, and may also be a display device including a liquid crystal display panel or an organic light emitting diode display panel, such as a display, a notebook computer, a television, a tablet computer, a mobile phone, and the like.

In summary, the thin film transistor and the display panel including the thin film transistor provided by the embodiments of the present application improve the conductivity of the thin film transistor by increasing the dielectric constant of the gate insulating layer. Compared with current thin film transistors, under the same size and the same driving conditions, a larger current can be conducted in the semiconductor layer of the thin film transistor of the present application. Under the condition of conducting the same magnitude of current, the thin film transistor of the present application can realize a smaller size design.

Figure 3:
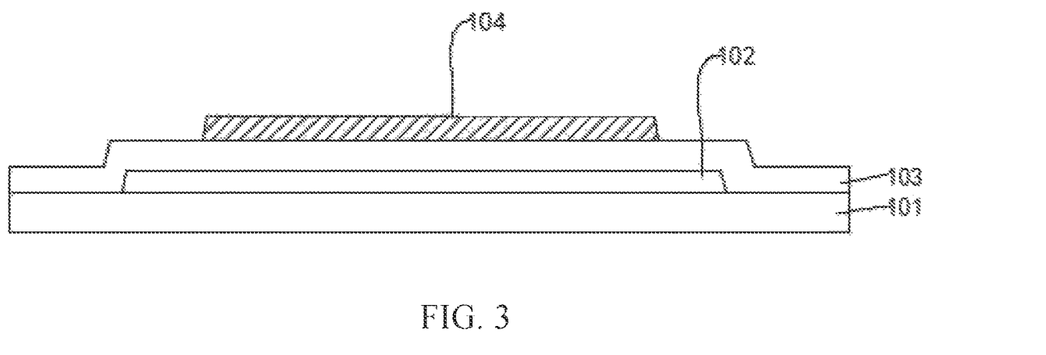
FIG. 3 is a schematic diagram of a structure of a thin film transistor manufacturing method provided by an embodiment of the present application after a semiconductor layer is formed.

An embodiment of the present application also provides a method of manufacturing a thin film transistor. Please refer to FIG. 3 to FIG. 7. The method for manufacturing a thin film transistor includes the following steps:

In step S101, referring to FIG. 3, a semiconductor layer 104 is formed on a substrate.

Specifically, the substrate includes a substrate 101, a light shielding layer 102, and a buffer layer 103. The substrate 101 may be a hard substrate, such as glass. It can also be a flexible substrate, such as polyimide. In this embodiment, the substrate 101 may be a transparent structure. In some other embodiments, it can also be set to a non-transparent structure according to requirements. The light shielding layer 102 is disposed on the substrate 101. The light shielding layer 102 may be made of opaque metal materials, such as molybdenum, aluminum, copper, titanium, and the like. According to requirements, the light shielding layer 102 may be a single-layer or double-layer film structure made of one or more of the foregoing metal materials. The thickness of the light shielding layer 102 on the substrate 101 may range from 500 angstroms to 2000 angstroms. The light shielding layer 102 defines a light-shielding area required for manufacturing the thin film transistor. The buffer layer 103 is disposed on the substrate 101 and covers the light shielding layer 102. The buffer layer 103 may be a single-layer film or a double-layer film made of silicon nitride, silicon oxide, or one of the two. The thickness of the buffer layer 103 range from 1000 angstroms to 5000 angstroms. The process of manufacturing the light shielding layer 102 and the buffer layer 103 may be a vapor deposition process.

The semiconductor layer 104 is fabricated on the buffer layer 103. The material of the semiconductor layer 104 may be one or more of indium gallium zinc oxide, indium tin zinc oxide, indium zinc tin oxide, indium gallium tin zinc oxide, and the like. In some other embodiments, the semiconductor layer 104 may also be referred to as an active layer or a channel layer or a semiconductor layer. The position of the semiconductor layer 104 corresponds to the position of the light shielding layer 102. The process of manufacturing the semiconductor layer 104 may be a vapor deposition process.

Figure 4:
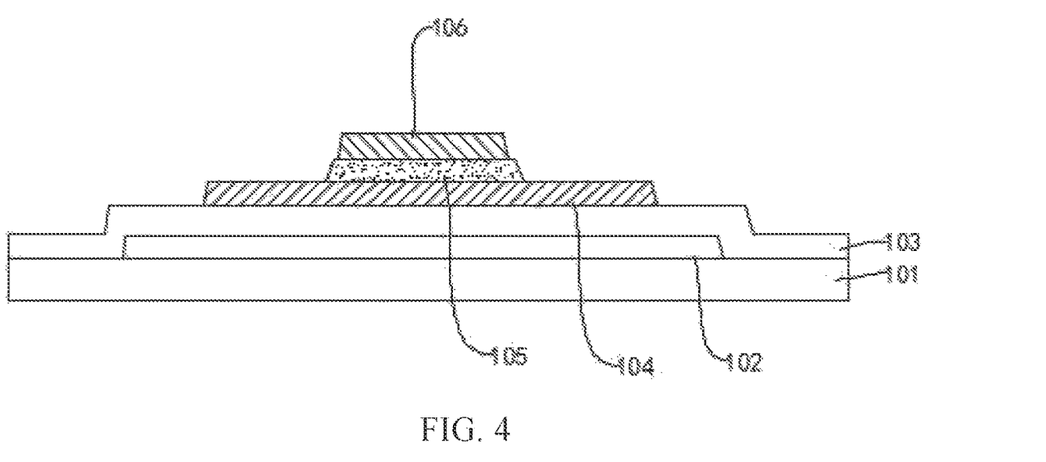
FIG. 4 is a schematic diagram of a first structure after a gate is formed by a method for forming a thin film transistor provided by an embodiment of the present application.

Step S102, referring to FIG. 4, a gate insulating layer 105 corresponding to the position of the semiconductor layer 104 is formed on the semiconductor layer 104, and the dielectric constant of the gate insulating layer 105 is greater than 4.

The process of manufacturing the gate insulating layer 105 may be a vapor deposition process. After depositing the film of the gate insulating layer 105, a patterned structure corresponding to the semiconductor layer 104 can be formed directly through an etching process, or it is also possible to form a patterned structure through an etching process together with the gate after the gate is fabricated next.

The gate insulating layer 105 is a single-layer film structure made of at least one of hafnium oxide and aluminum oxide. The thickness of the formed gate insulating layer 105 range from 900 angstroms to 3000 angstroms. In addition, the gate insulating layer 105 may also be a multilayer structure composed of a hafnium oxide film layer and an aluminum oxide film layer, such as a hafnium oxide/aluminum oxide double-layer structure, an aluminum oxide/hafnium oxide double-layer structure, or a hafnium oxide/aluminum oxide/hafnium oxide three-layer structure.

Figure 5:
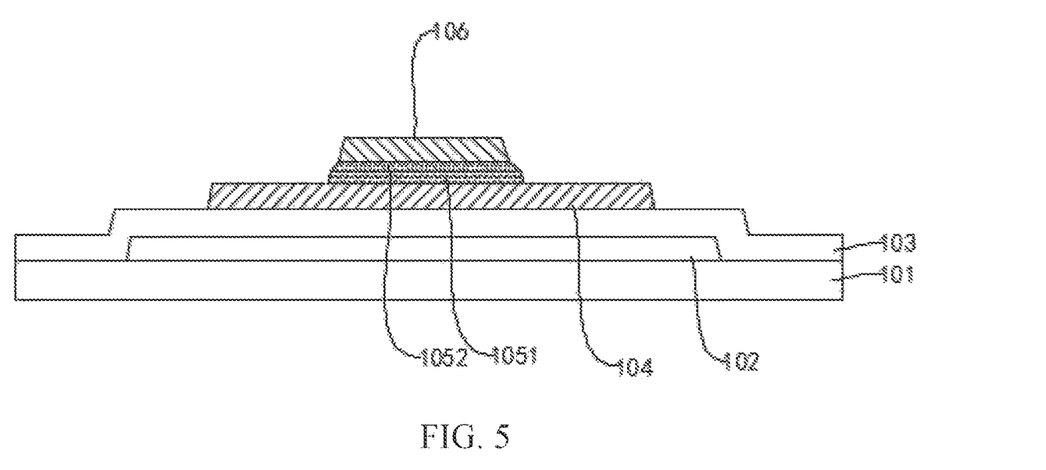
FIG. 5 is a schematic diagram of a second structure after a gate is formed by a method of forming a thin film transistor according to an embodiment of the present application.

In other embodiments, as shown in FIG. 5, the gate insulating layer 105 formed may include a first gate insulating layer 1051 disposed close to the semiconductor layer 104 and a second gate insulating layer 1052 disposed away from the semiconductor layer 104. The dielectric constant of the first gate insulating layer 1051 is greater than the dielectric constant of the second gate insulating layer 1052. The overall dielectric constant of the gate insulating layer composed of the first gate insulating layer 1051 and the second gate insulating layer 1052 is greater than 4. Optionally, the thickness of the first gate insulating layer 1051 may range from 100 angstroms to 2000 angstroms. The thickness of the second gate insulating layer 1052 may range from 800 angstroms to 2000 angstroms. The dielectric constant of the first gate insulating layer 1051 is greater than 9. The node constant of the second gate insulating layer 1052 may not be limited. The first gate insulating layer 1051 may be a single-layer film structure made of at least one of hafnium oxide and aluminum oxide, or may also be a multilayer structure composed of a hafnium oxide film layer and an aluminum oxide film layer. The second gate insulating layer 1052 may be made of silicon oxide.

Step S103, please continue to refer to FIGS. 4 and 5, and a gate 106 corresponding to the position of the semiconductor layer 104 is formed on the gate insulating layer 105.

The process of manufacturing the gate 106 may be a vapor deposition process. The gate 106 may be a single-layer or multi-layer metal film layer made of metal materials such as molybdenum, aluminum, copper, and titanium, such as molybdenum/aluminum/molybdenum three-layer structure, molybdenum/copper double-layer structure, or titanium/copper double-layer structure, etc.

Further, referring to FIG. 4 to FIG. 7, the manufacturing method of the thin film transistor further includes: using a photomask process to etch the gate 106 and the gate insulating layer 105 to achieve patterning. Active treatment is performed on the semiconductor layer 104 not covered by the gate insulating layer 105 and the gate 106 by a plasma doping process to form an active conductive region. An interlayer insulating layer 107 which is disposed on the buffer layer 103 and covers the semiconductor layer 104, the gate insulating layer 105 and the gate 106 is fabricated. The source and drain electrodes 108 disposed on the interlayer insulating layer 107 and the passivation layer 109 disposed on the interlayer insulating layer 107 and covering the source and drain electrodes 108 are fabricated.

Figure 6:
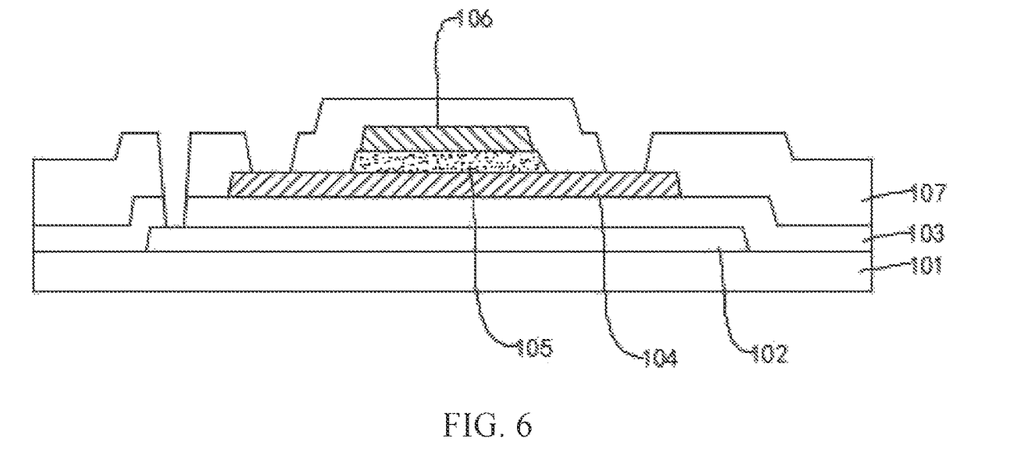
FIG. 6 is a schematic diagram of a structure of a thin film transistor manufacturing method provided by an embodiment of the present application after an interlayer insulating layer is formed.

Specifically, the interlayer insulating layer 107 may be made of silicon oxide material, and its thickness may range from 500 angstroms to 5000 angstroms. A plurality of via holes are formed on the interlayer insulating layer 107 through an etching process. Part of the via hole exposes the active conductive area of the semiconductor layer 104, and another part of the via hole may penetrate the interlayer insulating layer 107 and the buffer layer 103, thereby exposing a part of the light shielding layer 102.

Figure 7:
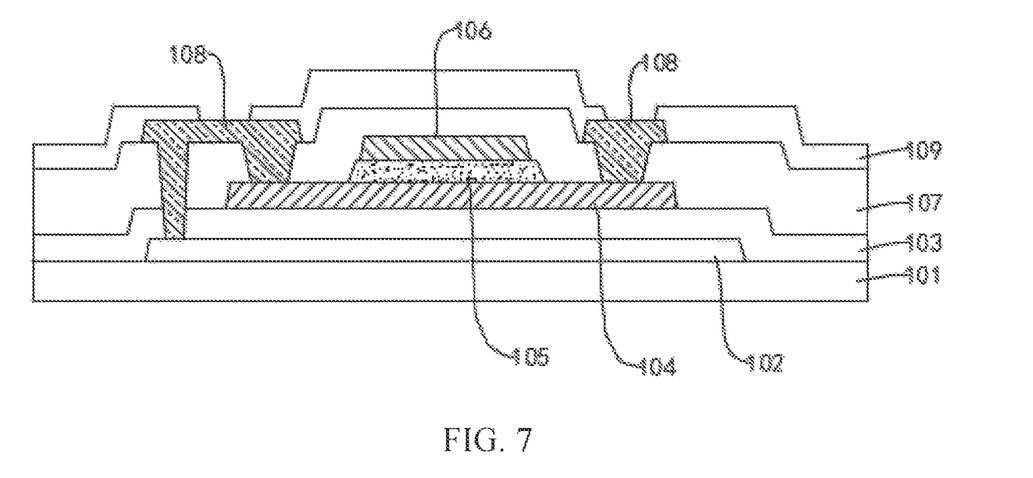
FIG. 7 is a schematic diagram of a structure of a thin film transistor manufacturing method provided by an embodiment of the present application after the manufacturing is completed.

The source and drain electrodes 108 are made by a vapor deposition process, and are coupled to opposite ends of the semiconductor layer 104 through via holes on the interlayer insulating layer 107. That is, the source and drain electrodes 108 are electrically connected to the active conductive area of the semiconductor layer 104, so that current can be transmitted between the source and drain electrodes 108 and the semiconductor layer 104. Part of the source and drain electrodes 108 are electrically connected to the light shielding layer 102 through via holes penetrating the interlayer insulating layer 107 and the buffer layer 103. Using the conductivity of the light shielding layer 102 to transmit electrical signals to a part of the source and drain electrodes 108 is beneficial to improve the response efficiency of the thin film transistor. The material of the source and drain electrodes 108 may be one or more of metal molybdenum, aluminum, copper, and titanium. The source and drain electrodes 108 may be a single-layer structure or a multi-layer structure made of one or more of the aforementioned materials, such as molybdenum/aluminum/molybdenum three-layer structure, molybdenum/copper double-layer structure, or titanium/copper double-layer structure, etc. The thickness of the source and drain electrodes 108 may range from 1000 angstroms to 10000 angstroms.

The passivation layer 109 is formed with openings through an etching process. The opening exposes a local area of the source and drain electrodes 108 so as to connect the source and drain electrodes 108 with other components. The passivation layer 109 may be made of silicon oxide material, and its thickness may range from 1000 angstroms to 5000 angstroms.

It should be noted that although the application is disclosed as above in specific embodiments, the above-mentioned embodiments are not intended to limit the application. Those of ordinary skill in the art can make various changes and modifications without departing from the spirit and scope of this application. Therefore, the protection scope of this application is subject to the scope defined by the claims.

What is claimed is:

1. A thin film transistor, comprising:
a semiconductor layer, a gate disposed corresponding to a position of the semiconductor layer, and a gate insulating layer disposed between and in contact with the semiconductor layer and the gate; wherein:
the gate insulating layer is divided into a first gate insulating layer disposed close to the semiconductor layer and a second gate insulating layer disposed close to the gate, and a dielectric constant of the first gate insulating layer is greater than a dielectric constant of the second gate insulating layer;
wherein a dielectric constant of the second gate insulating layer is greater than 4, a dielectric constant of the first gate insulating layer is greater than 9, and a dielectric constant of the gate insulating layer is greater than 4;
wherein a thickness of the first gate insulating layer is greater than a thickness of the second gate insulating layer;
wherein the first gate insulating layer is formed as a hafnium oxide/aluminum oxide/hafnium oxide layer three-layer structure, and the second gate insulating layer is a layer made of silicon oxide.

2. The thin film transistor according to claim 1, wherein a thickness of the gate insulating layer ranges from 900 angstroms to 3000 angstroms.

3. A display panel, comprising:
a substrate and a thin film transistor disposed on the substrate, wherein the thin film transistor comprises:
a semiconductor layer disposed on a surface of the substrate;
a gate insulating layer disposed on the semiconductor layer, wherein the gate insulating layer is divided into a first gate insulating layer disposed close to the semiconductor layer and a second gate insulating layer disposed on the first gate insulating layer, and a dielectric constant of the first gate insulating layer is greater than a dielectric constant of the second gate insulating layer;
a gate disposed on the gate insulating layer and corresponding to a position of the semiconductor layer;
wherein gate insulating layer is in contact with the semiconductor layer and the gate;
wherein a dielectric constant of the second gate insulating layer is greater than 4, a dielectric constant of the first gate insulating layer is greater than 9, and a dielectric constant of the gate insulating layer is greater than 4;
wherein a thickness of the first gate insulating layer is greater than a thickness of the second gate insulating layer;
wherein the first gate insulating layer is formed as a hafnium oxide/aluminum oxide/hafnium oxide layer three-layer structure, and the second gate insulating layer is a layer made of silicon oxide.

4. The display panel according to claim 3, wherein the display panel further comprises:
a light shielding layer disposed on the substrate;
a buffer layer disposed on the light shielding layer;
an interlayer insulating layer disposed on the buffer layer and covering the semiconductor layer, the gate insulating layer, and the gate;
source and drain electrodes disposed on the interlayer insulating layer; and
a passivation layer disposed on the interlayer insulating layer and covering the source and drain electrodes;
wherein the semiconductor layer is disposed on the buffer layer, and the source and drain electrodes are connected to the semiconductor layer through via holes on the interlayer insulating layer.

5. The display panel according to claim 3, wherein a thickness of the gate insulating layer ranges from 900 angstroms to 3000 angstroms.

6. The display panel according to claim 4, wherein a material for making the light shielding layer comprises molybdenum, aluminum, copper, and titanium, and a thickness of the light shielding layer ranges from 500 angstroms to 2000 angstroms.

7. The display panel according to claim 6, wherein a part of the source and drain electrodes are electrically connected to the light shielding layer through via holes penetrating the interlayer insulating layer and the buffer layer.

8. A method of manufacturing a thin film transistor, comprising:
forming a semiconductor layer on a substrate;
forming a gate insulating layer corresponding to a position of the semiconductor layer on the semiconductor layer, wherein the gate insulating layer is divided into a first gate insulating layer disposed close to the semiconductor layer and a second gate insulating layer disposed on the first gate insulating layer, and a dielectric constant of the first gate insulating layer is greater than a dielectric constant of the second gate insulating layer;
forming a gate corresponding to the position of the semiconductor layer on the gate insulating layer;
wherein gate insulating layer is in contact with the semiconductor layer and the gate;
wherein a dielectric constant of the second gate insulating layer is greater than 4, a dielectric constant of the first gate insulating layer is greater than 9, and a dielectric constant of the gate insulating layer is greater than 4;
wherein a thickness of the first gate insulating layer is greater than a thickness of the second gate insulating layer;
wherein the first gate insulating layer is formed as a hafnium oxide/aluminum oxide/hafnium oxide layer three-layer structure, and the second gate insulating layer is a layer made of silicon oxide.

9. The method of manufacturing the thin film transistor according to claim 8, wherein a step of forming the gate insulating layer corresponding to the position of the semiconductor layer on the semiconductor layer comprises:
forming the first gate insulating layer on the semiconductor layer using hafnium oxide and aluminum oxide;
forming the second gate insulating layer on the first gate insulating layer using silicon oxide.

* * * * *